(12) United States Patent
Carrender

(10) Patent No.: US 6,738,025 B2
(45) Date of Patent: May 18, 2004

(54) ANTENNA MATCHING CIRCUIT

(75) Inventor: Curtis Lee Carrender, Richland, WA (US)

(73) Assignee: Battelle Memorial Institute K1-53, Richland, WA (US)

( * ) Notice: Subject to any disclaimer, the term of this patent is extended or adjusted under 35 U.S.C. 154(b) by 446 days.

(21) Appl. No.: 09/797,539

(22) Filed: Feb. 28, 2001

(65) Prior Publication Data

US 2002/0118108 A1 Aug. 29, 2002

(51) Int. Cl.$^7$ .................... G08B 13/14; H04Q 1/00
(52) U.S. Cl. .................... 343/860; 340/572.4
(58) Field of Search ............ 343/860; 340/10.4, 340/572.2, 572.7, 572.1, 825.54, 825.69, 825.71, 825.16, 505; 342/44; 455/333, 318

(56) References Cited

U.S. PATENT DOCUMENTS 6,046,668 A * 4/2000 Forster .................. 340/10.4
6,140,924 A 10/2000 Chia et al. .............. 340/572.5
6,400,274 B1 * 6/2002 Duan et al. ............. 340/572.7

FOREIGN PATENT DOCUMENTS

WO  WO 00/67373  11/2000

* cited by examiner

Primary Examiner—James Clinger
(74) Attorney, Agent, or Firm—Seed IP Law Group PLLC

(57) ABSTRACT

A matching circuit for use with radio frequency identification tag antennas configured for modulated backscatter, the circuit including a stub circuit coupled to a detector diode and an antenna and sized and shaped to match a predetermined frequency. The stub circuit is also designed to couple to the antenna such that a resulting phase is seen at the output, preferably 180° from that seen at the input. In addition, the stub circuit is structured to perform as an antenna, thus increasing the sensitivity of the overall circuit and maximizing efficiency and performance.

37 Claims, 2 Drawing Sheets

ANTENNA MATCHING CIRCUIT

TECHNICAL FIELD

The present invention pertains to antenna circuits, and more specifically, to an impedance matching circuit for a modulated backscatter diode-antenna combination particularly adapted for use in radio frequency identification systems.

BACKGROUND OF THE INVENTION

Remote communication utilizing wireless equipment typically relies on radio frequency (RF) technology, which is employed in many industries. One application of RF technology is in locating, identifying, and tracking objects, such as animals, inventory, and vehicles.

RF identification (RFID) tag systems have been developed that facilitate monitoring of remote objects. As shown in FIG. 1, a basic RFID system 10 consists of three components, an antenna 12, a transceiver with decoder 14, and a transponder (commonly called an RF tag) 16 having its own antenna 24. In operation, the antenna 12 emits electromagnetic radio signals generated by the transceiver 14 to activate the tag 16. When the tag 16 is activated, data can be read from or written to the tag.

In some applications, the antenna 12 is a component of the transceiver and decoder 14 to become an interrogator (or reader) 18, which can be configured either as a hand held or a fixed-mount device. The interrogator 18 emits the radio signals 20 in a range from one inch to one hundred feet or more, depending upon its power output and the radio frequency used. When an RF tag 16 passes through the electromagnetic radio waves 20, the tag 16 detects the signal 20 and is activated. Data encoded in the tag 16 is then transmitted through reflection by a modulated data signal 22 through an antenna 24 in the tag 16 and to the interrogator 18 for subsequent processing.

An advantage of RFID systems is the non-contact, non-line-of-sight capability of the technology. Tags can be read through a variety of substances such as snow, fog, ice, paint, dirt, and other visually and environmentally challenging conditions where bar codes or other optically-read technologies would be useless. RF tags can also be read at remarkable speeds, in most cases responding in less than one hundred milliseconds.

There are three main categories of RFID tags. These are beam-powered passive tags, battery-powered semi-passive tags, and active tags. Each operates in fundamentally different ways.

The beam-powered RFID tag is often referred to as a passive device because it derives the energy needed for its operation from the radio frequency energy beamed at it. The tag rectifies the field and dynamically changes the reflective characteristics of the tag itself, creating a change in reflectivity that is seen at the interrogator. A battery-powered semi-passive RFID tag operates in a similar fashion, modulating its RF cross section in order to reflect a delta to the interrogator to develop a communication link. Here, the battery is the source of the tag's operational power. Finally, in the active RFID tag, a transmitter is used to create its own radio frequency energy powered by the battery.

Conventional RF tag systems utilize continuous wave backscatter to communicate data from the tag 16 to the interrogator 18. More specifically, the interrogator 18 transmits a continuous-wave radio signal to the tag 16, which modulates the signal 20 using modulated backscattering wherein the electrical characteristics of the antenna 24 are altered by a modulating signal from the tag that reflects a modulated signal 22 back to the interrogator 18. The modulated signal 22 is encoded with information from the tag 16. The interrogator 18 then demodulates the modulated signal 22 and decodes the information.

Conventional continuous wave backscatter RF tag systems that utilizes passive (no battery) RF tags require adequate power from the signal 20 to power the internal circuitry in the tag 16 used to modulate the signal back to the interrogator 18. Efficient collection of this energy from the signal 20 is necessary to maximize system performance. Impedance matching of antenna circuit components at the desired frequency is one method to optimize efficiency. However, size and performance constraints of RFID tag systems render existing impedance matching designs unfeasible.

SUMMARY OF THE INVENTION

The disclosed embodiments of the present invention are directed to a diode matching antenna circuit that includes a diode detector circuit having a first terminal coupled to an antenna and a second terminal; and a stub circuit coupled to the second terminal of the diode detecting circuit, the stub circuit structured to match the impedance of the diode detector circuit in combination with the antenna to maximize the performance of the diode detector circuit.

In accordance with another aspect of the present invention, a radio frequency identification tag is provided that includes a circuit for processing radio frequency identification signals in combination with an antenna circuit coupled to the processing circuit and configured from modulated backscatter, the antenna circuit having a diode detector circuit coupled to an antenna and to a stub circuit, the stub circuit configured to match the impedance of the diode detector circuit in combination with the antenna to maximize the performance of the diode detector circuit.

In accordance with another aspect of the invention, the stub circuit is structured to phase shift an output signal in relationship to an input signal. Ideally, the phase shift is about 180° as detected at the interrogator.

In accordance with another aspect of the invention, the stub circuit is structured as a single conductor that functions as an antenna in combination with the diode detector circuit and first antenna. In an integrated form of the diode matching antenna circuit, the stub circuit would comprise a predetermined length and width of metallization.

As will be readily appreciated from the foregoing, the disclosed embodiments of the present invention provide antenna impedance matching for a passive RF tag system that extracts a greater supply voltage from a received signal to achieve enhanced performance, such as a greater transmission range. This increase in the communication distance enables use of passive RF tags for broader applications, such as tracking and identifying inventory in large warehouses, battlefield weaponry, and animals, without increasing the size and cost of such tags.

BRIEF DESCRIPTION OF THE DRAWINGS

The foregoing objects, features, and advantages of the present invention will be discussed in detail in the following non-limiting description of specific embodiments in connection with the accompanying drawings.

DETAILED DESCRIPTION OF THE INVENTION

Figure 1:
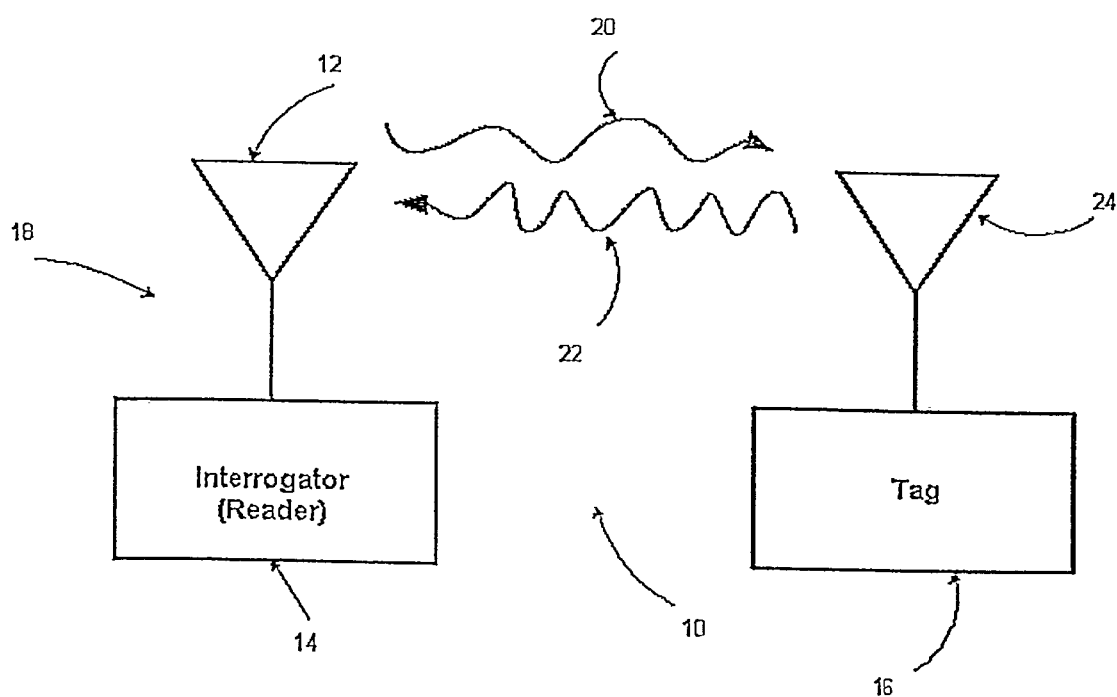
FIG. 1 is a schematic of an existing RF tag system.
Figure 2:
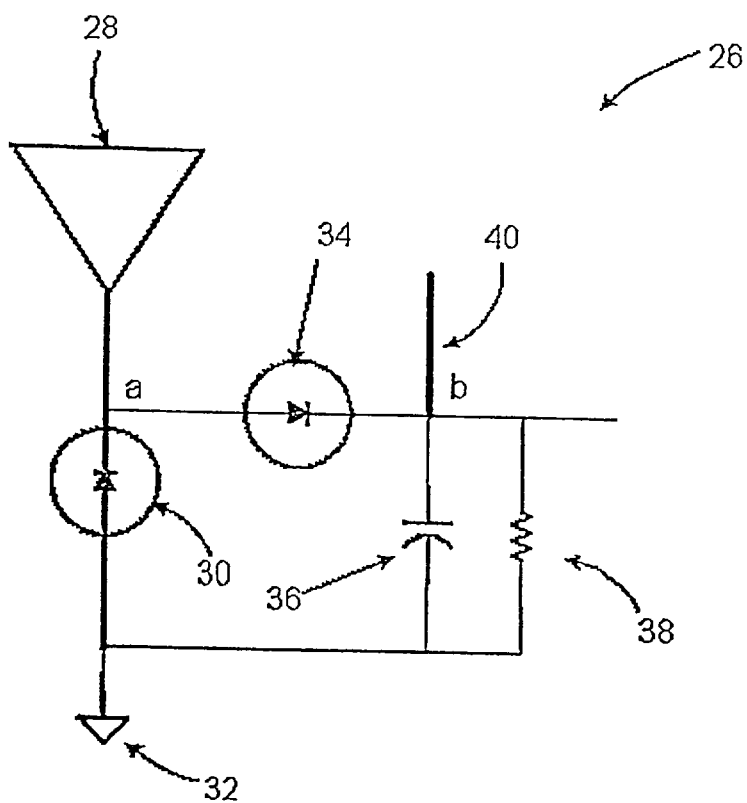
FIG. 2 is a schematic of a diode matching antenna circuit formed in accordance with the present invention.

Referring to FIG. 2, depicted therein is a circuit diagram of a power section 26 for a passive remote RFID tag associated with the tag antenna 28. The power section 26 is configured to supply power to an identification circuit (not shown) as known in the art. The antenna is preferably configured for modulated backscatter, commonly used with passive RFID tag systems.

The power section 26 includes a first detector diode 30 coupled between a common ground 32 and the antenna 28. More particularly, the anode of the first detector diode 30 is connected to the common ground 32, and the cathode is connected to the antenna 28 at a first node a. A second detector diode 34 has its anode coupled to the antenna 28 through node a and its cathode coupled to node b. The ground 32 can be replaced with controlled modulation, with the voltage at this point used to forward bias the diodes and create a phase shift in the signal reflected back at the interrogator.

A filter capacitor 36 and load resistor 38 may be coupled in parallel between node b and the common ground 32, thus forming, in combination with the first and second detector diodes 30,34 a half wave power supply having its output taken from node b. The capacitor 36 and resistor 38 may be partially or completely replaced by the parasitic capacitance or the resistance of other portions of the circuitry.

In the embodiment depicted in FIG. 2, a stub circuit 40 is provided having one end coupled to node b. The stub circuit 40 is formed of conductive material, such as a small trace of metallization in an integrated circuit, the length of which is chosen to match the particular impedance (inductive or capacitive) of the combination formed by the antenna 28 and the second diode 34.

In this configuration, the detector diodes are at a maximum sensitivity in the circuit when impedance is matched to the load. This maximum sensitivity will enhance the efficiency of the circuit, resulting in improved detector functioning and more power. Thus, matching the antenna impedance through the correct length and shape of the stub circuit 40 will enable the diodes, especially the second detector diode 34, to operate near optimum efficiency.

Alternative embodiments of the invention include coupling the stub circuit 40 directly to the antenna 28, or the stub circuit 40 may be used in a single diode configuration or a common voltage doubler combination. In addition, the second detector diode 34 may be one or two diodes removed from the antenna 28. The stub circuit 40 may also be open circuited or shorted.

The coupling of the stub circuit 40 is also designed to achieve a phase shift between the voltage signals at node a and node b. This is shown graphically in FIG. 3. In this condition, the second detector diode 34 has a maximum voltage placed across its junction at any particular time. The larger delta in impressed voltage will result in a larger detected voltage at the output taken from node b.

Figure 3:
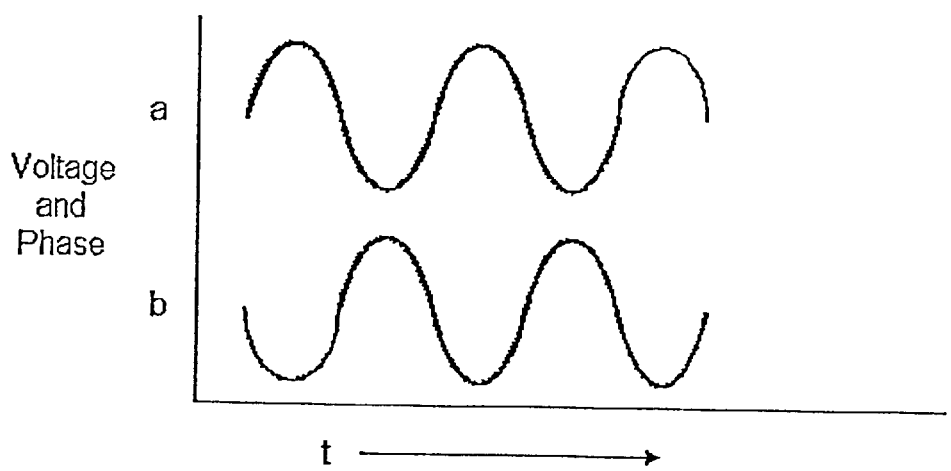
FIG. 3 illustrates non-rectified generalized waveform representations of signals present at nodes a and b of the circuit of FIG. 2.

In addition to matching the impedance associated with the antenna 28, the stub circuit 40 can also act as an antenna. The signal phase at node b is determined by the design and placement of the stub circuit 40. When the stub circuit 40 couples to a resident microwave field in such a way that the phase at node b is 180 degrees out of phase with the signal at node a (as shown in FIG. 3), the second detector diode 34 has an increased impressed instantaneous voltage. This increased impressed voltage enhances the sensitivity of the overall circuit, as described above with respect to FIG. 2.

Closure

The disclosed embodiments of the present invention thus provide enhanced supply voltage for passive RF tags to achieve greater communication distance with one or more interrogation units. The received energy signal may be transmitted from the interrogation units or energy may be extracted from existing sources, such as near-by radio stations, or even sunlight, thus keeping the size and cost of the RF tag to a minimum while increasing its range and its usefulness.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

What is claimed is:

1. A diode matching antenna circuit for a radio frequency identification tag, comprising:
   a diode detector circuit having a first terminal coupled to an antenna and a second terminal; and
   a stub circuit coupled to the second terminal of the diode detector circuit, the stub circuit structured to match the impedance of the diode detector circuit in combination with the antenna to maximize the performance of the diode detector circuit.

2. The circuit of claim 1, wherein the stub circuit is structured to phase shift an output signal at the second terminal of the diode detector circuit with respect to an input signal at the first terminal of the diode detector circuit.

3. The circuit of claim 2, wherein the phase shift is approximately 180° as detected at an interrogator.

4. The circuit of claim 2, wherein the stub circuit is structured to function as an antenna in combination with the diode detector circuit and the antenna.

5. The circuit of claim 2, comprising a filter capacitance and a load resistance provided by parasitic capacitance and parasitic resistance in the diode matching antenna circuit.

6. The circuit of claim 2, wherein the stub circuit is configured to forward bias diodes in the diode detector circuit and create a phase shift in an output signal reflected to an interrogator.

7. The circuit of claim 2, wherein the stub circuit comprises a length of conductor material.

8. The circuit of claim 7, wherein the diode detector circuit comprises a diode having an anode coupled to the antenna and a cathode coupled to the stub circuit.

9. The circuit of claim 8, wherein the diode detector circuit comprises a second detector diode.

10. The circuit of claim 9, wherein the second detector diode has an anode coupled to a common ground and a cathode coupled to the antenna.

11. The circuit of claim 9, further comprising an additional diode coupled between the first detector diode and the antenna.

12. A radio frequency identification tag, comprising:
    a circuit for processing radio frequency identification signals; and an antenna circuit coupled to the processing circuit and configured for modulated backscatter, the antenna circuit comprising:
- a detector circuit having a first terminal coupled to an antenna and a second terminal; and
- a stub circuit coupled to the second terminal of the detector circuit, the stub circuit structured to match the impedance of the detector circuit in combination with the antenna to maximize the performance of the detector circuit.

13. The circuit of claim 12, wherein the stub circuit is structured to phase shift an output signal at the second terminal of the detector circuit with respect to an input signal at the first terminal of the detector circuit.

14. The circuit of claim 13, wherein the phase shift is approximately 180° as detected at an interrogator.

15. The circuit of claim 13, wherein the detector circuit comprises a diode detector circuit and the stub circuit is structured to function as an antenna in combination with the diode detector circuit and the antenna.

16. The circuit of claim 13, wherein the stub circuit comprises a length of conductor material.

17. The circuit of claim 16, wherein the detector circuit comprises a diode having an anode coupled to the antenna and a cathode coupled to the stub circuit.

18. The circuit of claim 17, wherein the detector circuit comprises a second detector diode.

19. The circuit of claim 18, wherein the second detector diode has an anode coupled to a common ground and a cathode coupled to the antenna.

20. The circuit of claim 18, further comprising an additional diode coupled between the first detector diode and the antenna.

21. A radio frequency identification tag system, comprising:
- a transceiver configured to transmit and receive radio frequency signals; and
- at least one radio frequency identification tag, comprising:
  - a circuit for processing radio frequency identification signals; and
  - an antenna circuit coupled to the processing circuit and configured for modulated backscatter, the antenna circuit comprising:
    - a diode detector circuit having a first terminal coupled to an antenna and a second terminal; and
    - a stub circuit coupled to the second terminal of the diode detector circuit, the stub circuit structured to match the impedance of the diode detector circuit in combination with the antenna to maximize the performance of the diode detector circuit.

22. The circuit of claim 21, wherein the stub circuit is structured to phase shift an output signal at the second terminal of the diode detector circuit with respect to an input signal at the first terminal of the diode detector circuit.

23. The circuit of claim 22, wherein the phase shift is approximately 180°.

24. The circuit of claim 22, wherein the stub circuit is structured to function as an antenna in combination with the diode detector circuit and the antenna.

25. The circuit of claim 22, wherein the stub circuit comprises a length of conductor material.

26. The circuit of claim 25, wherein the diode detector circuit comprises a detector diode having an anode coupled to the antenna and a cathode coupled to the stub circuit.

27. The circuit of claim 26, wherein the diode detector circuit comprises a second detector diode.

28. The circuit of claim 27, wherein the second detector diode has an anode coupled to a common ground and a cathode coupled to the antenna.

29. The circuit of claim 27, further comprising an additional diode coupled between the first detector diode and the antenna.

30. A modulated backscatter antenna circuit for a radio frequency identification tag, the circuit comprising:
- means for detecting the radio frequency identification signals, the detecting means comprising an antenna means coupled to a first terminal of a diode means; and
- a stub circuit means for matching the impedance of the diode means in combination with the antenna means to maximize the performance of the diode means, the stub circuit means coupled to a second terminal of the diode means.

31. A radio frequency identification tag circuit, comprising:
- means for processing radio frequency signals; and
- radio frequency signal detection means coupled to the processing means and configured for modulated backscatter, the detection means comprising:
  - means for detecting the radio frequency identification signals, the detecting means comprising an antenna means and a diode means coupled together; and
  - a stub circuit means coupled to a node between the diode means and the radio frequency processing means for matching the impedance of the diode means in combination with the antenna means to maximize the performance of the diode means.

32. A diode matching antenna circuit, comprising:
- a diode detector circuit having a first terminal coupled to an antenna and a second terminal; and
- a stub circuit coupled to the second terminal of the diode detector circuit to match the impedance of the diode detector circuit in combination with the antenna to maximize performance of the diode detector circuit, the stub circuit structured to phase shift an output signal at the second terminal of the diode detector circuit with respect to an input signal at the first terminal of the diode detector circuit and to function as an antenna in combination with the diode detector circuit and the antenna.

33. A diode matching antenna circuit, comprising:
- a diode detector circuit having a first terminal coupled to an antenna and a second terminal; and
- a stub circuit comprising a length of conductor material having one end coupled to the second terminal of the diode detector circuit to match the impedance of the diode detector circuit in combination with the antenna to maximize performance of the diode detector circuit, the stub circuit structured to phase shift an output signal at the second terminal of the diode detector circuit with respect to an input signal at the first terminal of the diode detector circuit and to function as an antenna in combination with the diode detector circuit and the antenna.

34. A radio frequency identification tag, comprising:
- a circuit for processing radio frequency identification signals; and
- an antenna circuit coupled to the processing circuit and configured for modulated backscatter of the radio frequency identification signals, the antenna circuit comprising:
  - a detector circuit having a first terminal coupled to an antenna and a second terminal; and
  - a stub circuit coupled to the second terminal of the detector circuit to match the impedance of the detector circuit in combination with the antenna to maximize the performance of the detector circuit, the stub circuit structured to phase shift an output signal at the second terminal of the detector circuit with respect to an input signal at the first terminal of the detector circuit and to function as an antenna in combination with the detector circuit and the antenna circuit.

35. A radio frequency identification tag, comprising:

a circuit for processing radio frequency identification signals; and an antenna circuit coupled to the processing circuit and configured for modulated backscatter of the radio frequency identification signals, the antenna circuit comprising:
    a detector circuit having a first terminal coupled to an antenna and a second terminal; and
    a stub circuit comprising a length of conductive material having one end coupled to the second terminal of the detector circuit to match the impedance of the detector circuit in combination with the antenna to maximize the performance of the detector circuit, the stub circuit structured to phase shift an output signal at the second terminal of the detector circuit with respect to an input signal at the first terminal of the detector circuit and to function as an antenna in combination with the detector circuit and the antenna circuit.

36. A radio frequency identification system, comprising:

a transceiver configured to transmit and receive radio frequency signals; and at least one radio frequency identification tag, comprising:
    a circuit for processing radio frequency identification signals; and
    an antenna circuit coupled to the processing circuit and configured for modulated backscatter, the antenna circuit comprising:
        a diode detector circuit having a first terminal coupled to an antenna and a second terminal; and
        a stub circuit coupled to the second terminal of the diode detector circuit, the stub circuit structured to match the impedance of the diode detector circuit in combination with the antenna to maximize the performance of the diode detector circuit, and to phase shift an output signal at the second terminal of the diode detector circuit with respect to an input signal at the first terminal of the diode detector circuit, and further to function as an antenna in combination with the diode detector circuit and the antenna.

37. A radio frequency identification system, comprising:

a transceiver configured to transmit and receive radio frequency signals; and at least one radio frequency identification tag, comprising:
    a circuit for processing radio frequency identification signals; and
    an antenna circuit coupled to the processing circuit and configured for modulated backscatter, the antenna circuit comprising:
        a diode detector circuit having a first terminal coupled to an antenna and a second terminal; and
        a stub circuit comprising a length of conductive material having one end coupled to the second terminal of the diode detector circuit, the stub circuit structured to match the impedance of the diode detector circuit in combination with the antenna to maximize the performance of the diode detector circuit, and to phase shift an output signal at the second terminal of the diode detector circuit with respect to an input signal at the first terminal of the diode detector circuit, and further to function as an antenna in combination with the diode detector circuit and the antenna.

\* \* \* \* \*